(12) United States Patent
Katoch et al.

(10) Patent No.: US 8,861,295 B2
(45) Date of Patent: Oct. 14, 2014

(54) MEMORY CIRCUITS, SYSTEMS, AND METHODS FOR ACCESSING THE MEMORY CIRCUITS

(71) Applicant: Taiwan Semiconductor Manufacturing Company, Ltd., Hsinchu (TW)

(72) Inventors: Atul Katoch, Kanata (CA); Cormac Michael O'Connell, Kanata (CA)

(73) Assignee: Taiwan Semiconductor Manufacturing Company, Ltd. (TW)

(*) Notice: Subject to any disclaimer, the term of this patent is extended or adjusted under 35 U.S.C. 154(b) by 0 days.

(21) Appl. No.: 14/088,560

(22) Filed: Nov. 25, 2013

(65) Prior Publication Data

US 2014/0078844 A1    Mar. 20, 2014

Related U.S. Application Data (63) Continuation of application No. 12/831,385, filed on Jul. 7, 2010, now Pat. No. 8,619,483.

(60) Provisional application No. 61/237,561, filed on Aug. 27, 2009.

(51) Int. Cl.
| | |
|---|---|
| G11C 7/00 | (2006.01) |
| G11C 11/4091 | (2006.01) |
| G11C 11/4094 | (2006.01) |
| G11C 7/12 | (2006.01) |
| G11C 7/06 | (2006.01) |
| G11C 11/4097 | (2006.01) |

(52) U.S. Cl.
CPC .............. *G11C 7/06* (2013.01); *G11C 11/4091* (2013.01); *G11C 11/4094* (2013.01); *G11C 7/12* (2013.01); *G11C 11/4097* (2013.01)
USPC .......................................... 365/205; 365/206

(58) Field of Classification Search
USPC .......................................... 365/205, 206, 207
See application file for complete search history.

(56) References Cited

U.S. PATENT DOCUMENTS

| | | | |
|---|---|---|---|
| 6,496,040 B1 | 12/2002 | Narendra et al. | |
| 7,099,216 B2 | 8/2006 | Luk et al. | |
| 7,443,714 B1 * | 10/2008 | Kim | ............................. 365/149 |
| 7,848,131 B2 | 12/2010 | Kim | |
| 2008/0062737 A1 | 3/2008 | Manning et al. | |
| 2009/0175066 A1 * | 7/2009 | Kim | ............................. 365/149 |
| 2012/0008368 A1 | 1/2012 | Kajigaya | |

OTHER PUBLICATIONS

Barth, John et al., "A 500MHZ Random Cycle 1.5ns-Latency, SOI Embedded DRAM Macro Featuring a 3T Micro Sense Amplifier", ISSCC 2007, Feb. 14, 2007, Session 27, DRAM and ERAM, 27.1, pp. 486-487 and 617.

* cited by examiner

*Primary Examiner* — Vu Le
(74) *Attorney, Agent, or Firm* — Lowe Hauptman & Ham, LLP

(57) ABSTRACT

A sense amplifier includes a first transistor. The first transistor includes a gate connected to a bit line, and a first source/drain (S/D) electrically coupled with a global bit line. The sense amplifier further includes a second transistor. The second transistor includes a gate connected to a first signal line, and a first S/D coupled to the global bit line, wherein the second transistor is configured to pre-charge the bit line.

20 Claims, 6 Drawing Sheets

MEMORY CIRCUITS, SYSTEMS, AND METHODS FOR ACCESSING THE MEMORY CIRCUITS

CROSS-REFERENCE TO RELATED APPLICATIONS

The present application is a continuation of U.S. application Ser. No. 12/831,385, filed Jul. 7, 2010, which is a nonprovisional of and claims priority of U.S. Provisional Patent Application No. 61/237,561 filed Aug. 27, 2009, both of which are incorporated herein by reference in their entireties.

TECHNICAL FIELD

The present disclosure relates generally to the field of semiconductor circuits, and more particularly, to memory circuits, systems, and methods for accessing the memory circuits.

BACKGROUND

Memory circuits have been used in various applications. Conventionally, memory circuits can include DRAM and SRAM circuits. A DRAM circuit includes a plurality of memory cells. For conventional dynamic memory cells in which arrays of capacitive storage memory cells are provided, each memory cell has an access transistor. Data stored in such memory cells is actually a charge stored on a small capacitor. When the data is to be output, the access transistor is activated by a word line (WL) coupled with the gate or control terminal of the transistor. The access transistor can couple the capacitor to a bit line (BL) coupled to a sense amplifier for sensing the voltage of the capacitor.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

A conventional 3-transistor single ended sense amplifier has been proposed to sense data stored in DRAM cells. The conventional 3-transistor single ended sense amplifier has a PMOS transistor coupled with an NMOS transistor that are disposed between power voltages VDD and VSS. A gate of the PMOS transistor is coupled with a read bit line (RBL). A gate of the NMOS transistor is coupled with a write bit line (WBL). The conventional 3-transistor single ended sense amplifier also has a sensing NMOS transistor coupled between the read bit line RBL and the write bit line WBL. A gate of the sensing NMOS transistor is coupled to the bit line BL.

For sensing a datum stored within the DRAM cell, the bit line BL is precharged to the power voltage VSS. After precharging the bit line BL, the charge stored within the DRAM cell is charge shared with the bit line BL. If no substantial charge is stored within the DRAM cell, the voltage of the bit line BL may be slightly pulled up due to a leakage current. The slightly pulled-up voltage of the bit line BL does not turn on the sensing NMOS transistor. The turned-off sensing NMOS transistor isolates the read bit line RBL from the write bit line WBL. The read bit line RBL having a voltage, e.g., VDD, is free from being coupled with the write bit line WBL having a voltage, e.g., VSS. A global bit line GBL coupled with the read bit line RBL is free from sensing a substantial voltage change on the read bit line RBL. The datum output from the global bit line GBL is determined as "0".

If a substantial charge is stored within the DRAM cell, the voltage of the bit line BL can be substantially pulled up from the power voltage VSS due to the charge sharing. The pulled-up voltage of the bit line BL turns on the sensing NMOS transistor. The turned-on sensing NMOS transistor couples the read bit line RBL having a voltage, e.g., VDD, with the write bit line WBL having a voltage, e.g., VSS. The voltage of the read bit line RBL is substantially pulled down. A global bit line GBL coupled with the read bit line RBL senses a substantial voltage change of the read bit line RBL. The datum output from the global bit line GBL is determined as "1".

As noted, the sensing of the datum stored within the DRAM cell is related to the threshold voltage ($V_t$) of the sensing NMOS transistor. It is found that the threshold voltage $V_t$ of the sensing NMOS transistor may change due to variations of semiconductor manufacturing. Due to the variation of the threshold voltage $V_t$ of the sensing NMOS transistor, a voltage of the bit line BL may turn on the sensing NMOS transistor in some cases. In other cases, the same voltage of the bit line BL may not turn on the sensing NMOS transistor.

As noted, the conventional 3-transistor single ended sense amplifier uses a pair of the read bit line RBL and the write bit line WBL for sensing the voltage change of each bit line BL. A routing of the read bit line RBL and the write bit line WBL may use two or more metal layers and vias. The routing of the read bit line RBL and the write bit line WBL is complicated.

It is also found that the conventional 3-transistor single ended sense amplifier consists of the PMOS transistor and two NMOS transistors one of which is the NMOS sensing device. A dimension of the PMOS transistor is larger than that of each of the NMOS transistors. A large space between the NMOS transistors is used to accommodate the PMOS transistor. A large area of the conventional 3-transistor single ended sense amplifier is used.

Based on the foregoing, memory circuits, systems, and methods for accessing data stored within the memory circuits are desired.

It is understood that the following disclosure provides many different embodiments, or examples, for implementing different features. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
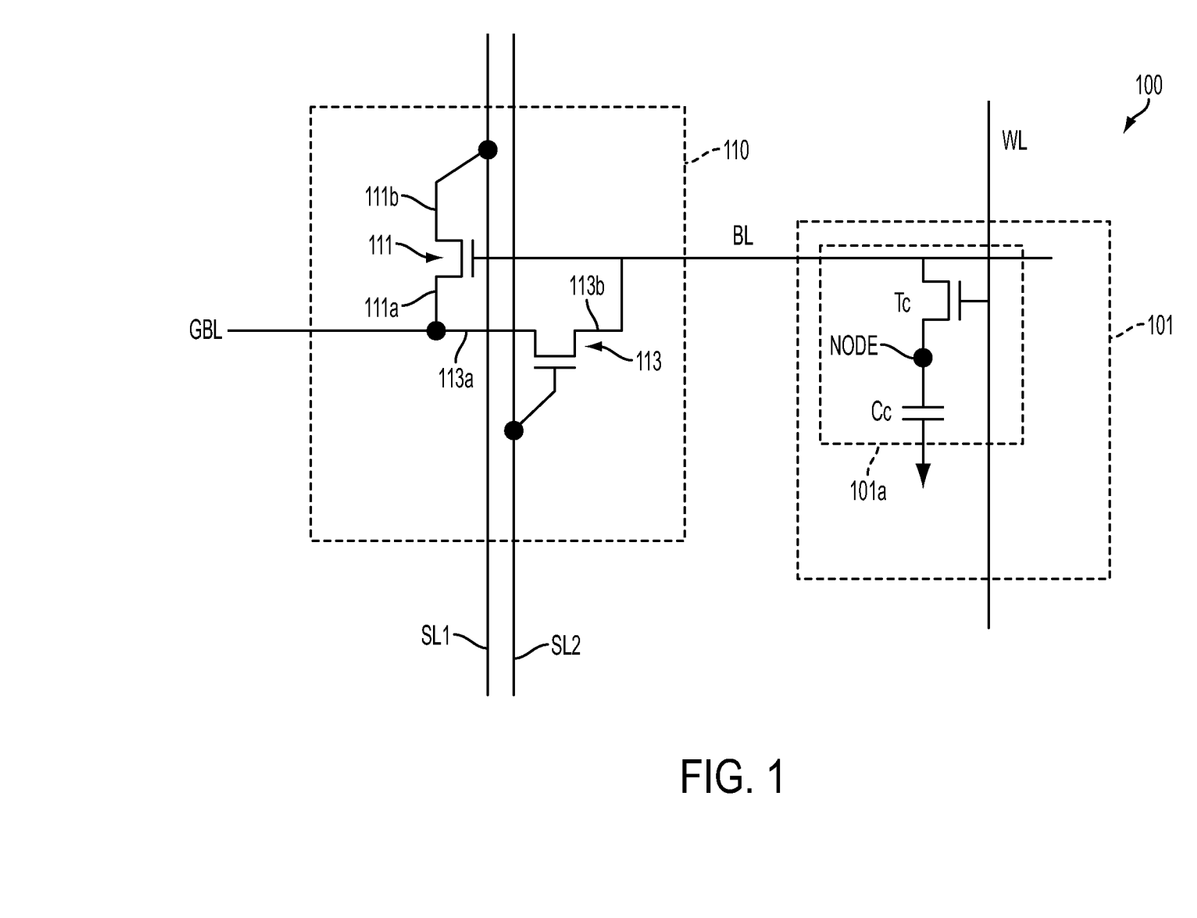
FIG. 1 is a schematic drawing illustrating an exemplary memory circuit.

FIG. 1 is a schematic drawing illustrating an exemplary memory circuit. In FIG. 1, a memory circuit 100 can include a memory array 101 including a plurality of word lines and a plurality of bit lines. The memory circuit 100 can be a dynamic random access memory (DRAM) circuit, an embedded DRAM circuit, a static random access memory (SRAM) circuit, an embedded SRAM circuit, a non-volatile memory circuit, e.g., FLASH, EPROM, $E^2$PROME, a field-programmable gate array circuit, a logic array circuit, and/or other memory circuit. The memory array 101 can include at least one memory cell 101a. The memory cell 101a can be coupled with a bit line (BL) and a word line (WL) of the memory array 101. For embodiments using a DRAM cell, the memory cell 101a can include a memory transistor $T_c$ and a capacitor $C_c$. The capacitor $C_c$ is capable of storing a charge representative of a datum, e.g., "0" or "1".

It is noted that though only one memory cell 101a is depicted, another cell (not shown) can be placed at the intersection of each of a plurality of word lines and the bit lines. A portion of the memory array 101 may have 8, 16, 32, 64, 128 or more columns that can be arranged in word widths. In some embodiments, the word lines can be laid out substantially orthogonally to the bit lines. In other embodiments, other arrangements of the word lines and bit lines can be provided.

Referring to FIG. 1, the memory circuit 100 can include a sense amplifier 110. The sense amplifier 110 can be coupled with the bit line BL. The sense amplifier is capable of precharging the bit line BL to a voltage that is substantially equal to and higher than a threshold voltage $V_t$ of a first transistor, e.g., transistor 111, of the sense amplifier 110. The transistor 111 can be referred to as a sensing device. In some embodiments, the voltage that is substantially equal to and higher than the threshold voltage $V_t$ of the transistor 111 can mean that the voltage is between about the threshold voltage $V_t$ of the transistor 111 and about a half of an internal power voltage (VDD). In other embodiments, the voltage that is substantially equal to and higher than the threshold voltage $V_t$ of the transistor 111 can mean that the voltage can desirably fully or partially turn on the transistor 111. In still other embodiments, the threshold voltage $V_t$ of the transistor 111 can be between about 250 mV and about 350 mV. It is noted that the threshold voltage $V_t$ of the transistor 111 described above is merely exemplary. The threshold voltage $V_t$ of the transistor 111 can vary due to the change of the processing technology. The scope of the invention is not limited thereto.

In some embodiments, a gate of the transistor 111 can be coupled with the bit line BL. A first source/drain (S/D), e.g., S/D 111a, of the transistor 111 can be coupled with a global bit line GBL. A second source/drain (S/D), e.g., S/D 111b, of the transistor 111 can be coupled with a first signal line, e.g., signal line SL1. In some embodiments, the global bit line GBL can be coupled with the sense amplifier 110 through a use of a column select control line (not shown) and/or column select coupling transistors (not shown). In this manner, many columns of memory cells may be arranged in sub-arrays and selectively coupled to the global bit line GBL.

Referring to FIG. 1, the sense amplifier 110 can include a second transistor, e.g., transistor 113. The transistor 113 can include a first source/drain (S/D), e.g., S/D 113a, coupled with the global bit line GBL. A second source/drain, e.g., S/D 113b, coupled with the bit line BL. A gate (not labeled) of the transistor 113 can be coupled with a second signal line, e.g., signal line SL2. In some embodiments, the signal line SL2 can receive a bank select signal. In other embodiments, the transistor 113 can have a threshold voltage that is higher than that of the transistor 111.

Following are descriptions regarding methods for accessing a memory cell. A dynamic memory can be refreshed periodically because the stored charge in the cells may leak away over time. Timing circuitry (not shown) can track the time elapsed since the last access to the memory cells and will cause the circuit to "refresh" the cells if desired. Refresh can be done, for example, by performing a read followed by a restore or "write back" cycle to the cells.

It is noted that any read of a memory cell of the memory cell 101a may result in charge leakages. The cell can be restored or rewritten at the end of the cycle. A "write" can be simply a read cycle with write data impressed on the respective local bit line during the "restore" portion of the cycle. For a write, the read data can be replaced or overwritten with the write data and then written into the cell. Thousands or even millions of these memory cells can be used to form a practical dynamic memory device.

Figure 2:
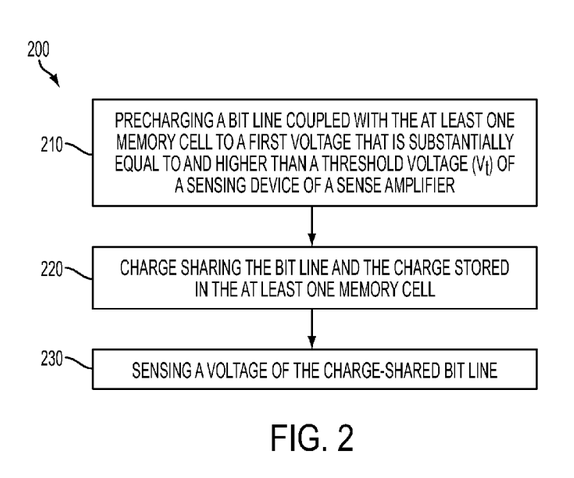
FIG. 2 is a flowchart illustrating an exemplary method for accessing a datum represented by a charge stored in at least one memory cell of a memory circuit.
Figure 3:
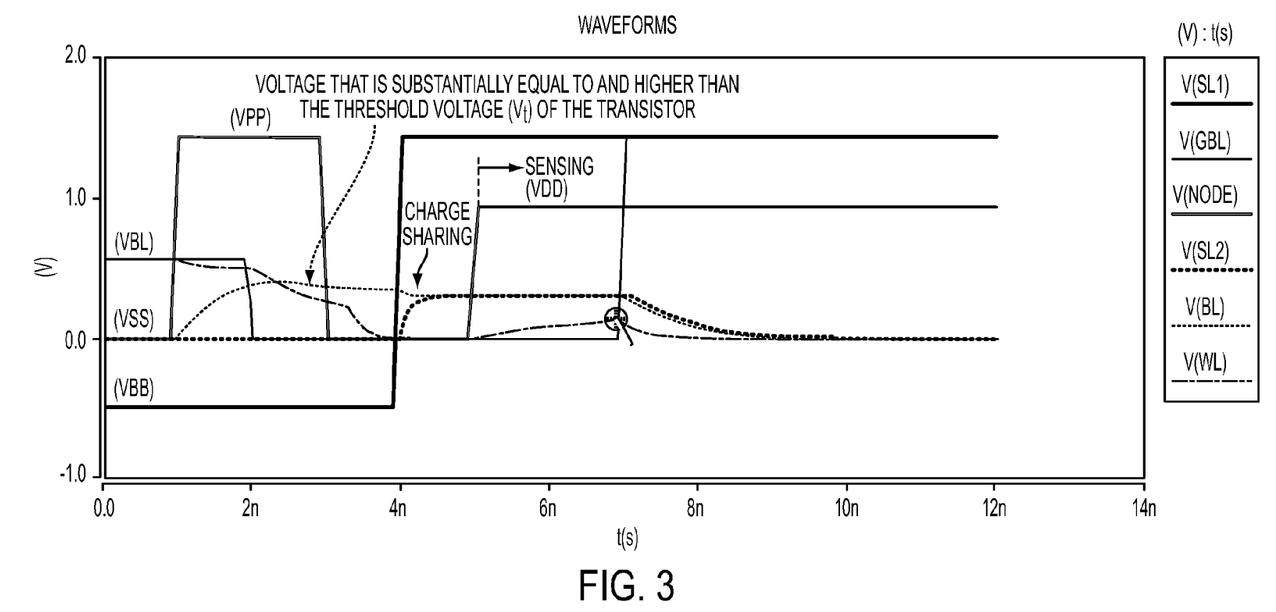
FIG. 3 is a schematic drawing illustrating waveforms for accessing a memory cell storing a datum "0".

Following is a description regarding an exemplary method for sensing a datum "0" stored within a memory cell. FIG. 2 is a flowchart illustrating an exemplary method for accessing a datum represented by a charge stored in at least one memory cell of a memory circuit. FIG. 3 is a schematic drawing illustrating waveforms for accessing a memory cell storing a datum "0". Referring to FIGS. 1-3, a method 200 can access a datum represented by a charge stored in the memory cell 101a of the memory circuit 100. In step 210, the bit line BL coupled with the memory cell 101a can be precharged to the voltage that is substantially equal to and higher than the threshold voltage $V_t$ of the transistor 111 of the sense amplifier 110.

In some embodiments, during the precharging period a voltage, e.g., VBB, (shown in FIG. 3) can be applied to the word line WL, turning off the memory transistor $T_c$. A voltage, e.g., VBL, can be applied to global bit line GBL and the signal line SL1. The voltage VBL can be, for example, about 0.6 VDD, VDD/2, or other desired value. A voltage, e.g., VPP, can be applied to the signal line SL2, turning on the transistor 113. The turned-on transistor 113 can couple the bit line BL with the global bit line GBL. Since the global bit line GBL has been charged to the voltage VBL, the voltage of the bit line BL can be pulled up toward the voltage VBL. Since the capacitor $C_c$ is free from including a substantial charge for representing a datum "0", the voltage of a node between the capacitor $C_c$ and the memory transistor $T_c$ can be substantially equal to 0, ground, or VSS.

After a desired time interval, the global bit line GBL can be floating and the voltage of the signal line SL1 can be pulled down to a voltage, e.g., VSS. In some embodiments, the voltage of the bit line BL can be pulled up and higher than the threshold voltage $V_t$ of the transistor 111. In other embodiments, the voltage of the bit line BL can be pulled up to around VDD/2. In still other embodiments, the voltage of the bit line BL can be pulled up to a voltage between the threshold voltage $V_t$ of the transistor 111 and VDD/2. The pulled-up voltage of the bit line BL can turn on the transistor 111. The turned-on transistor 111 can couple the signal line SL1 with the global bit line GBL. Since the voltage of the signal line SL1 is pulled down to the voltage VSS, the voltage of the global bit line GBL can be pulled down.

Regarding the bit line BL, the turned-transistors 111 and 113 can couple the bit line BL with the signal line SL1. Since the voltage of the signal line SL1 is pulled down to the voltage VSS, the voltage of the bit line BL can be pulled down. As noted, the transistor 113 can have the threshold voltage that is higher than that of the transistor 111 and the bit line BL is coupled with the signal line SL1 through the transistors 111 and 113. The voltage of the bit line BL can be pulled down slightly. In some embodiments, the voltage of the bit line BL can be pulled down slower than that of the global bit line GBL. The bit line BL can be precharged to the voltage that is substantially equal to and higher than the threshold voltage $V_t$ of the transistor 111.

As noted, the bit line BL is precharged to the voltage that is substantially equal to and higher than the threshold voltage $V_t$ of the transistor 111. The voltage of the signal line SL2 can be pulled down to a voltage, e.g., VSS, turning off the transistor 113. The turned-off transistor 113 can desirably isolate the bit line BL from the global bit line GBL and the signal line SL1. The voltage of the bit line BL can be kept substantially equal to and higher than the threshold voltage $V_t$ of the transistor 111. Since the voltage of the bit line BL can still turn on the transistor 111, the voltage of the global bit line GBL can be further pulled down to the voltage VSS.

Referring to FIGS. 1-3, in step 220 the bit line BL can be charge shared with the capacitor memory $C_c$ of the cell 101a. For charge sharing, the word line WL can be pulled up to a voltage, e.g., VPP, turning on the memory transistor $T_c$. The turned-on memory transistor $T_c$ can couple the capacitor $C_c$ and the bit line BL. The charge of the capacitor $C_c$ and the charge on the bit line BL can be shared. As noted, the voltage of the node between the capacitor $C_c$ and the memory transistor $T_c$ is substantially equal to 0, the voltage of the node can be pulled up. In contrary, the voltage of the charge-shared bit line BL is pulled down to a voltage that is smaller than the threshold voltage $V_t$ of the transistor 111. The pulled-down voltage of the charge-shared bit line BL can turn off the transistor 111.

Referring again to FIGS. 1-3, step 230 can sense the voltage of the charge-shared bit line BL. In some embodiments sensing the voltage of the bit line BL, if the voltage of the charge-shared bit line is smaller than the threshold voltage $V_t$ of the transistor 111 of the sense amplifier 110, the datum stored within the memory cell 101a can represent "0".

For example, the voltage of the signal line SL1 can be pulled up to a voltage, e.g., VDD. As noted, the pulled-down voltage of the charge-shared bit line BL turns off the transistor 111. The turned-off transistor 111 can isolate the global bit line GBL from the signal line SL1. The voltage of the global bit line GBL can be substantially free from being pulled up. A global sense amplifier GSA (not shown) can be substantially free from sensing the voltage of the global bit line GBL. A datum "0" of the memory cell 101a can be output. In some embodiments, the voltage of the global bit line GBL can be pulled up slightly due to leakages of the transistors 111 and/or 113. Since the pulled-up voltage of the global bit line GBL is substantially lower than a predetermined voltage level, the global sense amplifier GSA can be substantially free from sensing a voltage of the global bit line GBL. A datum "0" of the memory cell 101a can still be output. In some embodiments, the predetermined voltage level can be about 160 mV. In other embodiments, the predetermined voltage level can be about 100 mV. The values of the predetermined voltage level are merely exemplary and the scope of the invention is not limited thereto.

Figure 4:
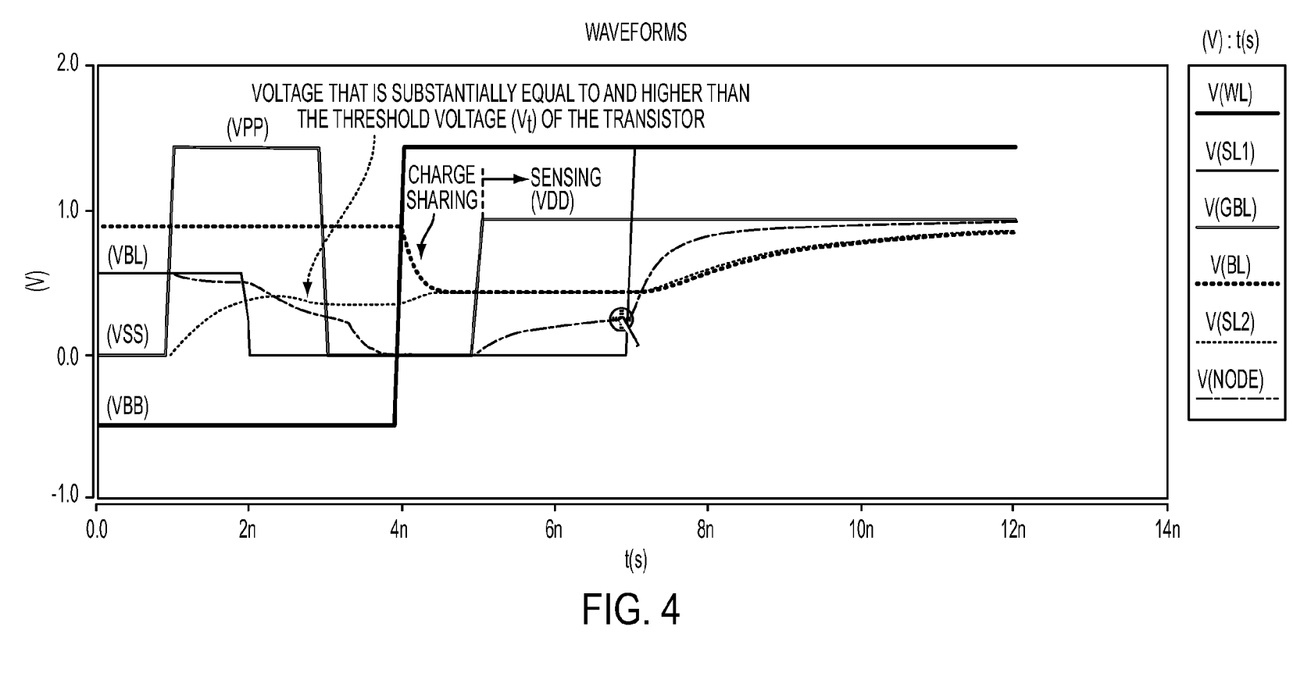
FIG. 4 is a schematic drawing illustrating waveforms for accessing a memory cell storing a datum "1".

Following are descriptions regarding an exemplary method for sensing a datum "1" stored within a memory cell. FIG. 4 is a schematic drawing illustrating waveforms for accessing a memory cell storing a datum "1". In some embodiments, the method 200 for accessing the memory cell storing a datum "1" can precharge the bit line BL in the way similar to that for accessing the memory cell storing a datum "0" described above in conjunction with FIGS. 1-3. Since the capacitor $C_c$ includes a substantial charge for representing a datum "1", the voltage of the node between memory transistor $T_c$ and the capacitor $C_c$ can be high, e.g., about 0.9 V.

Referring to FIGS. 1-2 and 4, in step 220 the bit line BL can be charge shared with the capacitor $C_c$ of the memory cell 101a. For charge sharing, the word line WL can be pulled up to a voltage, e.g., VPP, turning on the memory transistor $T_c$. The turned-on memory transistor $T_c$ can couple the capacitor $C_c$ and the bit line BL. The charge of the capacitor $C_c$ and the charge on the bit line BL can be shared. As noted, the voltage of the node between the capacitor $C_c$ and the memory transistor $T_c$ is high. The node can be pulled down. In contrary, the voltage of the charge-shared bit line BL can be pulled up to a voltage that is higher than the threshold voltage $V_t$ of the transistor 111. The pulled-up voltage of the charge-shared bit line BL can turn on the transistor 111.

Referring again to FIGS. 1-2 and 4, step 230 can sense the voltage of bit line BL. In some embodiments sensing the voltage of the bit line BL, if the voltage of the charge-shared bit line is not smaller than the threshold voltage $V_t$ of the transistor 111 of the sense amplifier 110, the datum stored within the memory cell 101a can represent "1".

For example, the voltage of the signal line SL1 can be pulled up to a voltage, e.g., VDD. As noted, the pulled-up voltage of the charge-shared bit line BL turns on the transistor 111. The turned-on transistor 111 can couple the global bit line GBL with the signal line SL1. The voltage of the global bit line GBL can be desirably pulled up. A global sense amplifier GSA (not shown) can substantially sense the pulled-up voltage of the global bit line GBL. A datum "1" of the memory cell 101a can be output.

It is noted that the voltage levels, VBB, VSS, VDD, VPP, and/or VBL described above in conjunction with FIGS. 3 and 4 are merely exemplary. The pull-up and/or pull-down of the voltage levels are also merely exemplary. One of skill in the art can modify the waveforms and operating sequences responding thereto to achieve a desired operation for accessing data stored within the memory cell. It is also noted that the data "0" and "1" representing the memory cell with and without charge, respectively, are merely exemplary. In some embodiments, an inverter can be added to the output of the global sense amplifier such that opposite data can be outputted.

As noted, the conventional 3-transistor single ended sense amplifier precharges the bit line BL to the voltage VSS. The conventional 3-transistor single ended sense amplifier has the issue of the threshold voltage variation of the NMOS sensing device. The routing of the read bit line RBL and the write bit line WBL of the conventional 3-transistor single ended sense amplifier is too complicated. The conventional 3-transistor single ended sense amplifier has a large space between the NMOS transistors to accommodate the PMOS.

In contrary to the conventional 3-transistor single ended sense amplifier, the sense amplifier 110 can precharge the bit line BL to the voltage that is substantially equal to and higher than the threshold voltage of the transistor 111 of the amplifier 110. The precharged voltage of the bit line BL can vary in responding to the change of the threshold voltage of the transistor 111. If the threshold voltage of the transistor 111 may be changed due to, for example, the variation of the semiconductor manufacturing process, the precharged voltage of the bit line BL can change accordingly. The sense amplifier 110 can desirably access data stored within memory cells of the memory circuit.

It is found that the sense amplifier 110 is free from including the routing of the read bit line RBL and the write bit line WBL of the conventional 3-transistor single ended sense amplifier. The routing of the bit line portion of the sense amplifier 110 can be desired. It is also found that the sense amplifier 110 can be free from including the PMOS transistor of the conventional 3-transistor single ended sense amplifier. The area of the sense amplifier 110 can be desirably reduced.

Figure 5:
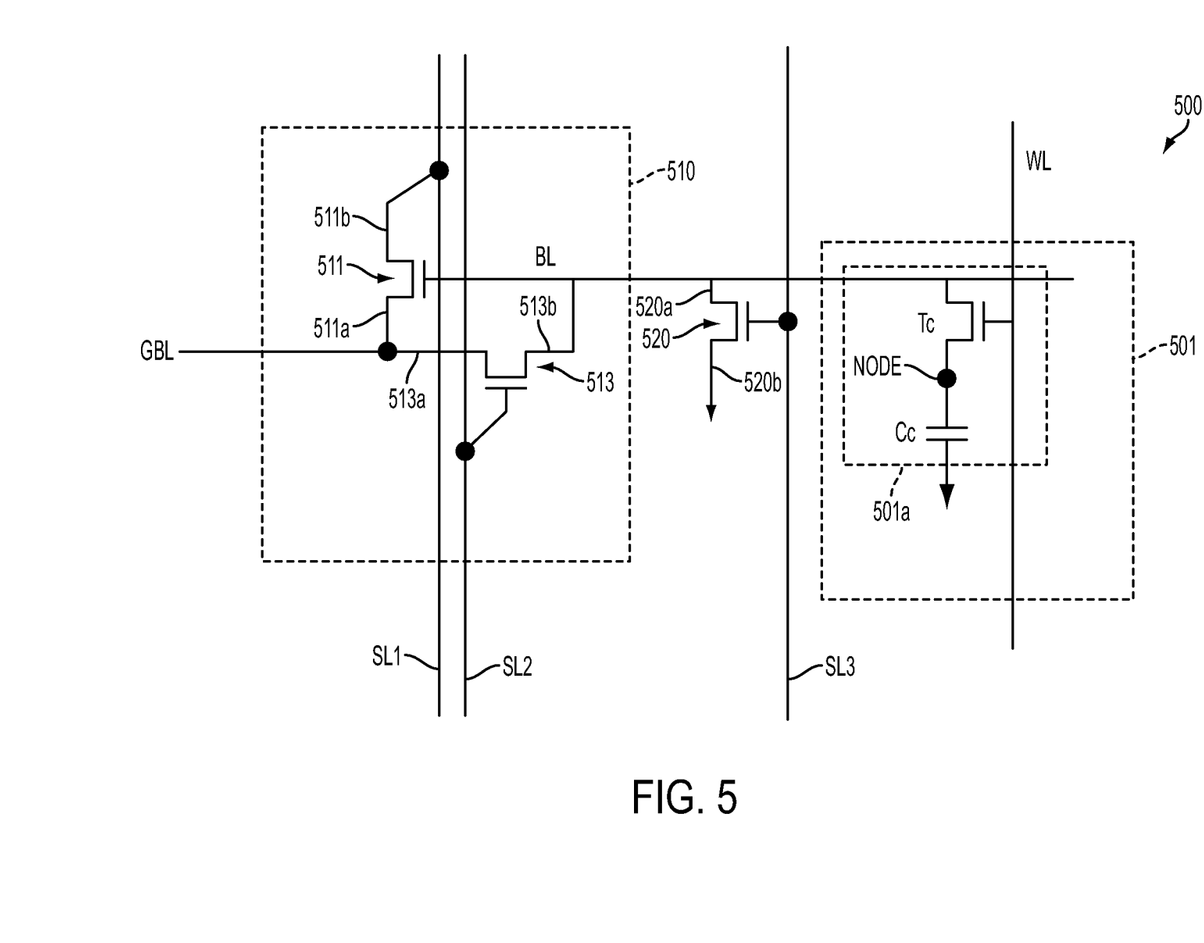
FIG. 5 is a schematic drawing illustrating another exemplary memory circuit including a precharge transistor.

FIG. 5 is a schematic drawing illustrating another exemplary memory circuit including a precharge transistor. Items of FIG. 5 that are the same items in FIG. 1 are indicated by the same reference numerals, increased by 400. In FIG. 5, a memory circuit 500 can include a precharge transistor 520 coupled with the bit line BL. A gate of the precharge transistor 520 can be coupled with a signal line SL3. A S/D 520a of the precharge transistor 520 can be coupled with the bit line. Another S/D 520 of the precharge transistor 520 can be coupled with a ground or VSS.

In some embodiments, before step 210 (shown in FIG. 2) a voltage of the signal line SL3 can be pulled up to a voltage, e.g., VDD, turning on the precharge transistor 520. The turned-on precharge transistor 520 can couple the bit line BL with ground or VSS for discharging a charge of the bit line BL. The charge may be resulted from, e.g., leakages of the transistors 511, 513, and/or the memory transistor $T_c$.

Figure 6:
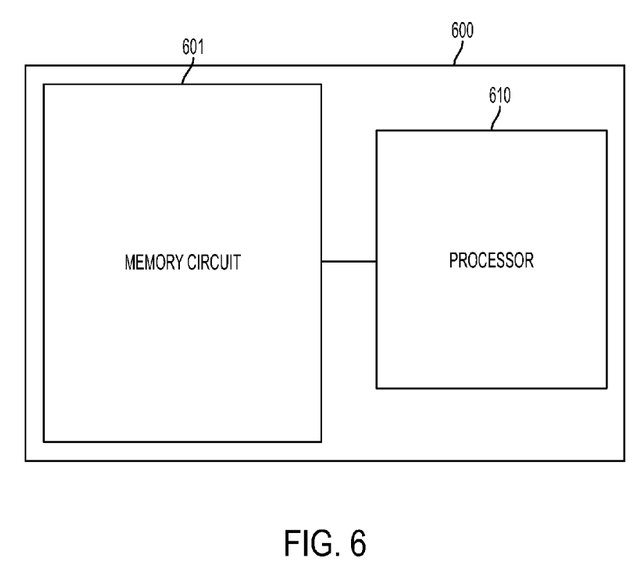
FIG. 6 is a schematic drawing showing a system including an exemplary memory circuit.

FIG. 6 is a schematic drawing showing a system including an exemplary memory circuit. In FIG. 6, a system 600 can include a processor 610 coupled with the memory circuit 601. The memory circuit 601 can be similar to the memory circuit 100 or 500 described above in conjunction with FIGS. 1 and 5. The processor 610 is capable of accessing the datum stored in the memory cell of the memory circuit 601. In some embodiments, the processor 610 can be a processing unit, central processing unit, digital signal processor, or other processor that is suitable for accessing data of memory circuit.

In some embodiments, the processor 610 and the memory circuit 601 can be formed within a system that can be physically and electrically coupled with a printed wiring board or printed circuit board (PCB) to form an electronic assembly. The electronic assembly can be part of an electronic system such as computers, wireless communication devices, computer-related peripherals, entertainment devices, or the like.

In some embodiments, the system 600 including the memory circuit 100 can provide an entire system in one IC, so-called system on a chip (SOC) or system on integrated circuit (SOIC) devices. These SOC devices may provide, for example, all of the circuitry needed to implement a cell phone, personal data assistant (PDA), digital VCR, digital camcorder, digital camera, MP3 player, or the like in a single integrated circuit.

One aspect of this description relates to a sense amplifier. The sense amplifier includes a first transistor. The first transistor includes a gate connected to a bit line, and a first source/drain (S/D) electrically coupled with a global bit line. The sense amplifier further includes a second transistor. The second transistor includes a gate connected to a first signal line, and a first S/D coupled to the global bit line, wherein the second transistor is configured to pre-charge the bit line.

Another aspect of this description relates to a method of using a sense amplifier. The method includes selectively connecting a bit line to a global bit line, using a first transistor, based on a voltage level of a first signal line. The method further includes precharging the bit line, and selectively connecting a second signal line, different from the first signal line, to the global bit line using a second transistor, wherein the second transistor has a first source/drain electrically coupled with the global bit line.

Still another aspect of this description relates to a sense amplifier. The sense amplifier includes a first transistor, the first transistor configured to be selectively activated based on a voltage level on a bit line, and to selectively connect a global bit line to a first signal line. The sense amplifier further includes a second transistor, the second transistor configured to be selectively activated based on a voltage level on a second signal line, and to selectively connect the global bit line to the bit line. The sense amplifier is free of p-type metal-oxide-semiconductor (PMOS) transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A sense amplifier comprising:
   a first transistor, the first transistor comprising:
      a gate connected to a bit line (BL), and
      a first source/drain (S/D) electrically coupled with a global bit line (GBL); and
   a second transistor, the second transistor comprising:
      a gate connected to a first signal line, and
      a first S/D coupled to the global bit line, wherein the second transistor is configured to pre-charge the bit line.

2. The sense amplifier of claim 1, wherein the first transistor further comprises a second S/D coupled to a second signal line different from the first signal line.

3. The sense amplifier of claim 2, wherein the bit line is configured to be selectively connected to the second signal line.

4. The sense amplifier of claim 1, wherein the second transistor further comprises a second S/D coupled to the bit line.

5. The sense amplifier of claim 1, wherein the first signal line is configured to receive a bank select signal.

6. The sense amplifier of claim 1, wherein the first transistor is an n-type metal-oxide-semiconductor (NMOS) transistor and the second transistor is an NMOS transistor.

7. The sense amplifier of claim 1, wherein the sense amplifier is free of p-type metal-oxide-semiconductor (PMOS) transistors.

8. A method of using a sense amplifier, the method comprising:
   selectively connecting a bit line to a global bit line, using a first transistor, based on a voltage level of a first signal line;
   precharging the bit line; and
   selectively connecting a second signal line, different from the first signal line, to the global bit line using a second transistor, wherein the second transistor has a first source/drain electrically coupled with the global bit line.

9. The method of claim 8, wherein precharging the bit line comprises precharging the bit line to a voltage equal to or greater than a threshold voltage of the second transistor.

10. The method of claim 8, wherein precharging the bit line comprises:
supplying a first voltage to the global bit line;
supplying the first voltage to the second signal line; and
supplying a second voltage to the first signal line, the second voltage is different from the first voltage.

11. The method of claim 8, further comprising:
floating the global bit line; and
pulling the second signal line to a ground voltage.

12. The method of claim 8, further comprising selectively connecting the bit line to the second signal line through the first transistor and the second transistor.

13. The method of claim 8, further comprising outputting a low logical value if a voltage on the bit line is less than a threshold voltage of the second transistor.

14. The method of claim 8, further comprising outputting a high logical value if a voltage on the bit line is equal to or greater than a threshold voltage over the second transistor.

15. A sense amplifier comprising:
a first transistor, the first transistor configured to be selectively activated based on a voltage level on a bit line, and to selectively connect a global bit line to a first signal line; and
a second transistor, the second transistor configured to be selectively activated based on a voltage level on a second signal line, and to selectively connect the global bit line to the bit line,
wherein the sense amplifier is free of p-type metal-oxide-semiconductor (PMOS) transistors.

16. The sense amplifier of claim 15, wherein the first signal line is configured to receive a bank select signal.

17. The sense amplifier of claim 15, wherein the first transistor is an n-type metal-oxide-semiconductor (NMOS) transistor.

18. The sense amplifier of claim 15, wherein the second transistor is an NMOS transistor.

19. The sense amplifier of claim 15, wherein the second transistor is configured to precharge the bit line.

20. The sense amplifier of claim 15, wherein second transistor has a threshold voltage greater than a threshold voltage of the first transistor.

* * * * *